(12) United States Patent
Brommer et al.

(10) Patent No.: US 7,495,357 B2
(45) Date of Patent: Feb. 24, 2009

(54) XRAM GENERATOR WITH AN OPENING SWITCH

(75) Inventors: Volker Brommer, Bühl (DE); Emil Spahn, Eimeldingen (DE)

(73) Assignee: Deutsch-Franzosisches Forschungsinstitut Saint-Louis, Saint Louis (FR)

( * ) Notice: Subject to any disclaimer, the term of this patent is extended or adjusted under 35 U.S.C. 154(b) by 502 days.

(21) Appl. No.: 11/339,947

(22) Filed: Jan. 26, 2006

(65) Prior Publication Data

US 2006/0215464 A1 Sep. 28, 2006

(30) Foreign Application Priority Data

Mar. 24, 2005 (DE) .................. 10 2005 014 043

(51) Int. Cl.
*H03K 3/00* (2006.01)
(52) U.S. Cl. ...................................... 307/106
(58) Field of Classification Search ................. 307/106
See application file for complete search history.

(56) References Cited

U.S. PATENT DOCUMENTS

| | | | |
|---|---|---|---|
| 4,613,765 A | 9/1986 | Honig et al. | |
| 4,642,476 A | 2/1987 | Honig et al. | |
| 4,670,662 A * | 6/1987 | Goldstein et al. | 307/106 |
| 6,888,268 B1 * | 5/2005 | Stallings | 307/126 |

OTHER PUBLICATIONS

W. Weck et al., Superconducting inductive Pulsed Power Supply For Electromagnetic Launchers: Design Aspects and Experimental Investigation of Laboratory Set-up, IEEE Transactions on Magnetics, IEEE Service Center, New York, NY, US, Bd. 33, Nr. 1, vol. 33, No. 1, Jan. 1997, Seiten pp. 524-527.

M. Kanter et al., Institute of Electrical and Electronics Engineers: "Repetitve Operation of an Xram Circuit" Digest of Technical Papers of the International Pulsed Power Conference. Albuquerque, Jun. 21-23, 1993 New York, IEEE, US. Bd. vol. 1 Conf. 9, Jun. 21, 1993, Seiten 92-94 XP000531063.

E. Van Dijk, —Cooperstein et al. Institute of Electrical and Electronics Engineers: Experimental Results Obtained With The 1 Ma Resonant Series Counterpulse Opening Switch System, Developed At TNO, Digest of technical papers of the 11th IEEE International pulsed powerconference. Baltimore, MD, Jun. 29-Jul. 2, 1997, Digest of Technical Papers of the Internatioanl Pulsed Power Conference, New York, NY: IEEE, US, Bd. vol. 1, Jun. 29, 1997 Seiten 287-292, XP000861643.

European International Search Report Aug. 9, 2007.

* cited by examiner

*Primary Examiner*—Michael J Sherry
*Assistant Examiner*—Dru M Parries
(74) *Attorney, Agent, or Firm*—RatnerPrestia

(57) ABSTRACT

A circuit which produces a current pulse through a load element, includes a primary energy storage unit and a secondary energy storage unit which can be charged up by the primary energy storage unit; an opening switching element which is configured to interrupt or establish a connection between the primary energy storage unit and the secondary energy storage unit; and a closing switch, which is configured to interrupt or establish a connection between the secondary energy storage unit and the load element and a counter current element which is connected to the opening switching element such that a counter current flows from the counter current element through the opening switching element when the closing switch is closed.

14 Claims, 3 Drawing Sheets

XRAM GENERATOR WITH AN OPENING SWITCH

The present invention relates to a circuit for producing a current pulse through a load element and in particular to an XRAM generator with at least one opening switch in accordance with the counter current method.

In numerous applications in the field of short-time physics and energy electronics, very fast switching elements are needed in order to be able to switch very high currents, for example above 100 kA, on and/or off within very short time spans, for example in the range of less than one microsecond, in order for example to produce a large current pulse when co-operating with an inductive energy storage unit. Inductive energy storage units present great advantages due to their high energy density for pulse current supplies and can be charged from current sources, such as for example batteries or rotating machines which for example function as generators. Through adapted charging and discharging sequences, high repetitions of pulse generation can be attained, wherein the energy to be transferred is supplied comparatively slowly from the current source to the inductive storage unit during the charging sequence. In order to then abruptly transfer the energy taken on from the inductive storage unit into a load to be driven, the current flow in the storage circuit is interrupted with the aid of opening switches.

The power output of the current sources used for charging is comparatively small in comparison to the power ultimately required at the load. For a magnetic dynamic storage unit (MDS), for example, the maximum power output in accordance with the current prior art is in the region of a few megawatts, wherein the currents which can be outputted are in the range below 10 kA for driving voltages of a few 100 V. In high-power pulse technology, however, power and currents in and beyond the range of gigawatts and a few 100 kA, respectively, can be required for various applications. In order to generate pulses using an inductive storage unit, a current multiplier is thus required.

Figure 1A:
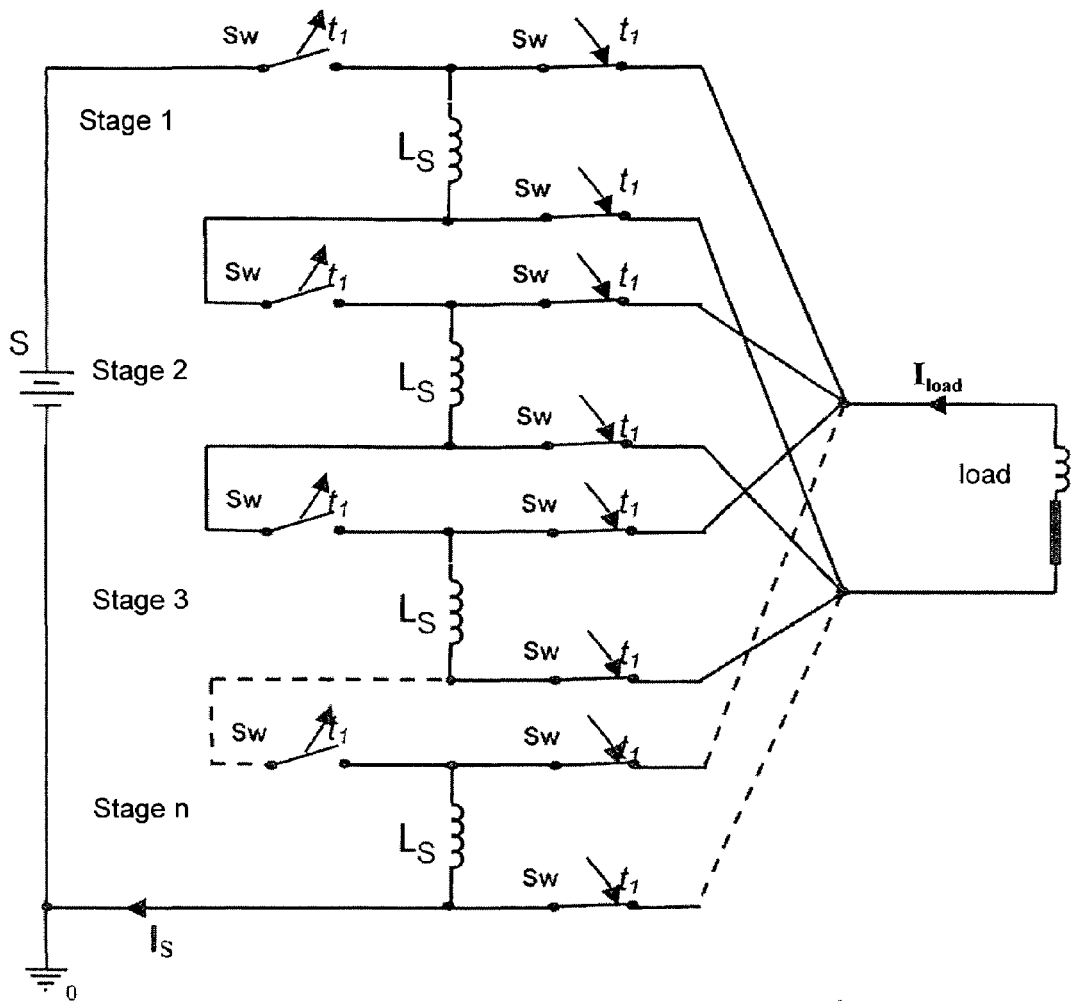

One way of multiplying a charge current is the known XRAM design, in which through corresponding circuitry, two or more inductive storage coils $L_s$ are "charged up" in a series circuit containing n stages, as shown in FIG. 1A. If the switches connecting the inductivities are open simultaneously at time $t_1$ and if a connection to the load is also established through additional commutating switches, then the storage coils $L_s$ are discharged in a circuit which is then arranged in parallel. The individual currents of the coil sections are thus added, to form the total current $I_{load}$.

Figure 1B:
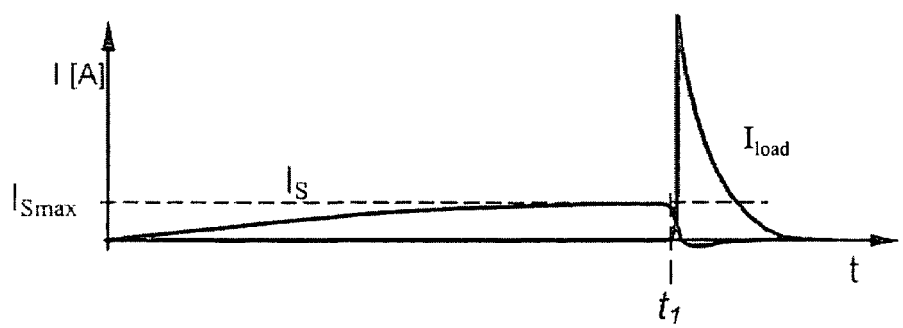

FIG. 1B shows the charge current curve $I_s$ of the storage coils $L_s$ and of the pulse current $I_{load}$ at the load, which increases steeply after the switching time $t_1$.

A prototype of such an inductive storage unit in accordance with the XRAM principle is introduced by Weck W., Ehrhart P., Müller A., Reiner G. in "Superconducting Inductive Pulsed Power Supply for Electromagnetic Launchers, IEEE Transactions on Magnetics", Vol. 33, No. 1, January 1997.

The essential requirement for the principle described above to function is appropriate opening switches such as for example mechanical switches, gas discharge switches, superconductive switches or semiconductor switches, wherein semiconductor switches exhibit advantages, especially with respect to maintenance costs, repetition rate and durability.

With regard to the use of semiconductor switches in connection with the XRAM principle, research has already been carried out using GTO thyristors as opening switches, such as is for example described by M. Kanter, R. Cerny, N. Shaked, Z. Kaplan in "Repetitive Operation of an XRAM Circuit", Propulsion Physics Laboratory Soreq NRC, Yavne 70600, Israel and M. Kanter, S. Singer, R. Cerny, Z. Kaplan in "Multikilojoule Inductive Modulator with solid-state opening switches", IEEE Transactions on Power Electronics, Vol. 7, No. 2, April 1992. For actively opening semiconductor switches, i.e. for example so-called GTO thyristors, MOSFET elements or IGBT elements, however, the following difficulties arise as compared to conventional thyristors:

During the charging phase of the inductive storage unit, such switches have to be able to carry high currents in the range of several kiloamperes over a relatively long time span of for example 100 ms to 10 s and then reliably interrupt them. The decisive variable here is the designation of the so-called load integral $I^2dt$ which for actively opening semiconductor switches is small as compared to thyristors. In particular during repetitive operation, difficulties occur with regard to overload.

The forward resistances and/or the power dissipation of the actively opening switches are larger as compared to thyristors. Therefore, especially in a series circuit of several switches, the sum of the power dissipation is considerable.

When switching off, voltages on the opening switches arise at the load due to the wire inductivities present and/or the load inductivity due to the rise in current. If very steep increases in current of for example more than one 1 kA/µs are required at the load, then high voltages in the kilovolt range quickly arise at the switches and exceed their voltage tolerance. These switching voltages are to be counteracted either with a series circuit or with complex attenuator members, wherein each of these measures incurs corresponding disadvantages.

All the actively opening switches involved have to be controlled by electronic units, wherein the complexity of the control electronics increases with the number of opening switches involved. Furthermore, problems with switching delay (jitter) of individual components can arise with such control.

It is an object of the present invention to suggest a circuit and a method for producing a current pulse, which enable a charge current to be simply interrupted.

This object is solved by a circuit and a method as defined in the independent claims. Advantageous embodiments follow from the dependent claims.

A circuit in accordance with the invention for producing a current pulse through a load element comprises: at least one primary energy storage unit such as for example a current source formed by a battery, an accumulator or a generator, preferably a direct current source, and at least one secondary energy storage unit such as for example an inductive element or a storage coil which can be charged up, i.e. for example charged with a current flow, by the primary energy storage unit; at least one opening switching element such as for example a thyristor, IGBT, GTO, MOSFET or other switch, such as for example a fast mechanical switch which can preferably be switched off at zero power, with which a connection between the primary energy storage unit and the at least one secondary energy storage unit can be interrupted after charging up or can be established in order to charge up; and at least one closing switch such as for example a thyristor, an air-gap switch or a fast mechanical switch, with which a connection between the at least one secondary energy storage unit and a load element, such as for example an inductor system of an electromagnetic thrower or projector, can be established or interrupted; characterised by at least one counter current element such as for example a capacitor which, for example while charging the secondary energy storage unit(s), is charged up such that when discharging, e.g. after connecting the secondary energy storage unit to a load, it produces a counter current to the charge current through the at least one opening switching element, and which is connected to the at least one opening switching element such that a counter current, directed against the charge current, flows from the at least one counter current element through the at least one opening switching element, when for example the closing switch is closed, such that each secondary energy storage unit can be separated, preferably at zero power, from the primary energy storage unit.

Preferably, at least one auxiliary switch, such as for example a diode, is connected in anti-parallel with the opening switch, formed for example by a thyristor, in order to take on the counter current after the current zero-crossing and in order to interrupt the thyristor at zero power.

The circuit is preferably constructed in multiple stages and comprises several, i.e. two, three or more than three secondary energy storage units, each with assigned opening switches and counter current elements, wherein the secondary energy storage units with the opening switches are for example connected in series to a current source during the charge sequence and can be connected in parallel with the load for discharging, wherein in each of these circuits which are then connected in parallel, at least one current direction element, such as for example a diode, and advantageously also at least one counter current element is provided, which can for example be connected in parallel with a current direction element.

The invention further relates to an electromagnetic projector or thrower which is known per se, or to a load driven by a pulsed current, with a circuit as described above for controlling the projector coils and/or an inductor system and/or the load.

In a method in accordance with the invention for producing a current pulse through a load element, at least one secondary energy storage unit is charged up by a primary energy storage unit, wherein the load element is essentially separated from the secondary energy storage unit during the charge-up sequence, i.e. for example, the closing switch is open and/or a semiconductor switch is in its blocking state, and after the load element is connected to the at least one secondary energy storage unit, a counter current is produced, for example by a capacitor, through at least one opening switch which connects the at least one secondary energy storage unit to the primary energy storage unit, such that the opening switch can for example be opened at zero power or switches to its blocking state, since for example the current falls below a holding current.

The known XRAM design is thus improved in accordance with the invention by using opening switches, such as for example thyristors, which can be switched off in accordance with the counter current method. The counter current circuit is advantageously designed such that the counter current pulse is carried directly across the load, as shown by way of example in FIG. 3. The counter current pulse thus flows via both the primary energy storage unit S and additionally via the load, such that a very large current gradient $dI_{load}/dt$ can then be realised as required, which can be controlled and/or predetermined by the capacitor $C_2$, wherein the voltage drop on the main thyristor $Th_1$ remains minimal during the critical switching phase.

In principle, the possibility exists of deliberately oversizing the amplitude of the counter current such that in the load circuit, a counter current is superimposed on the current pulse, which can present an advantage depending on the type of load. If, for example, an active electromagnetic protective means is to be fed, then it is advantageous to charge it with as high a current pulse as possible, at as steep a current increase rate as possible, immediately after its initialisation.

The counter current pulse over time can also be adapted to a broad extent to certain requirements. Thus, several counter current branches connected in parallel can for example be used which are fired sequentially with a small offset in time. The staged counter current thus arising is for example advantageous if, for the main thyristor $Th_1$, only specimens with a relatively large recombination time are available. In return, this measure presents the advantage that the counter current integral can be minimised, and the energy in the capacitor $C_2$ is thus optimally used. By this opposite approach to oversizing, a much wider and more flexible application spectrum results.

Figure 2:
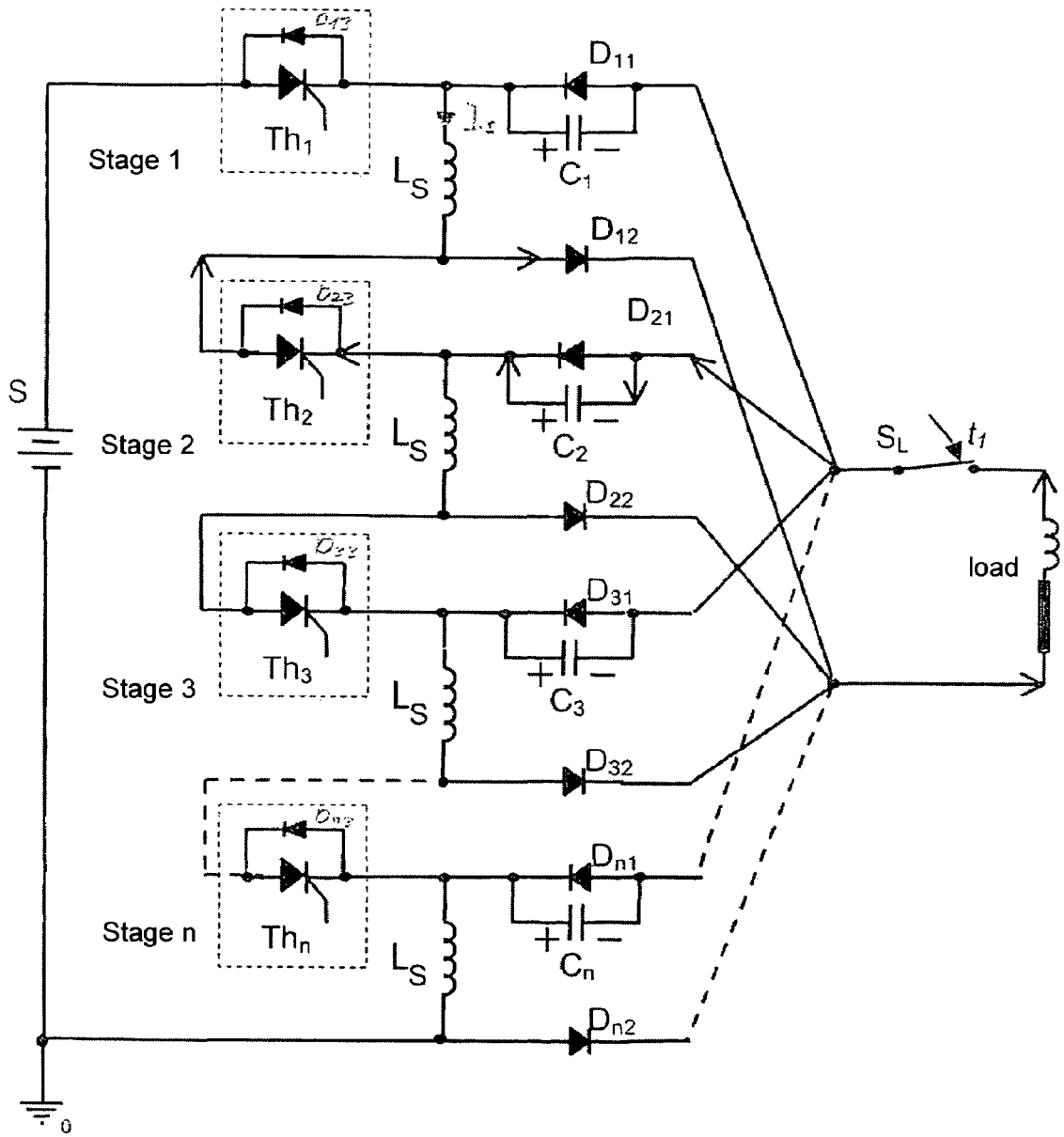
Figure 3:
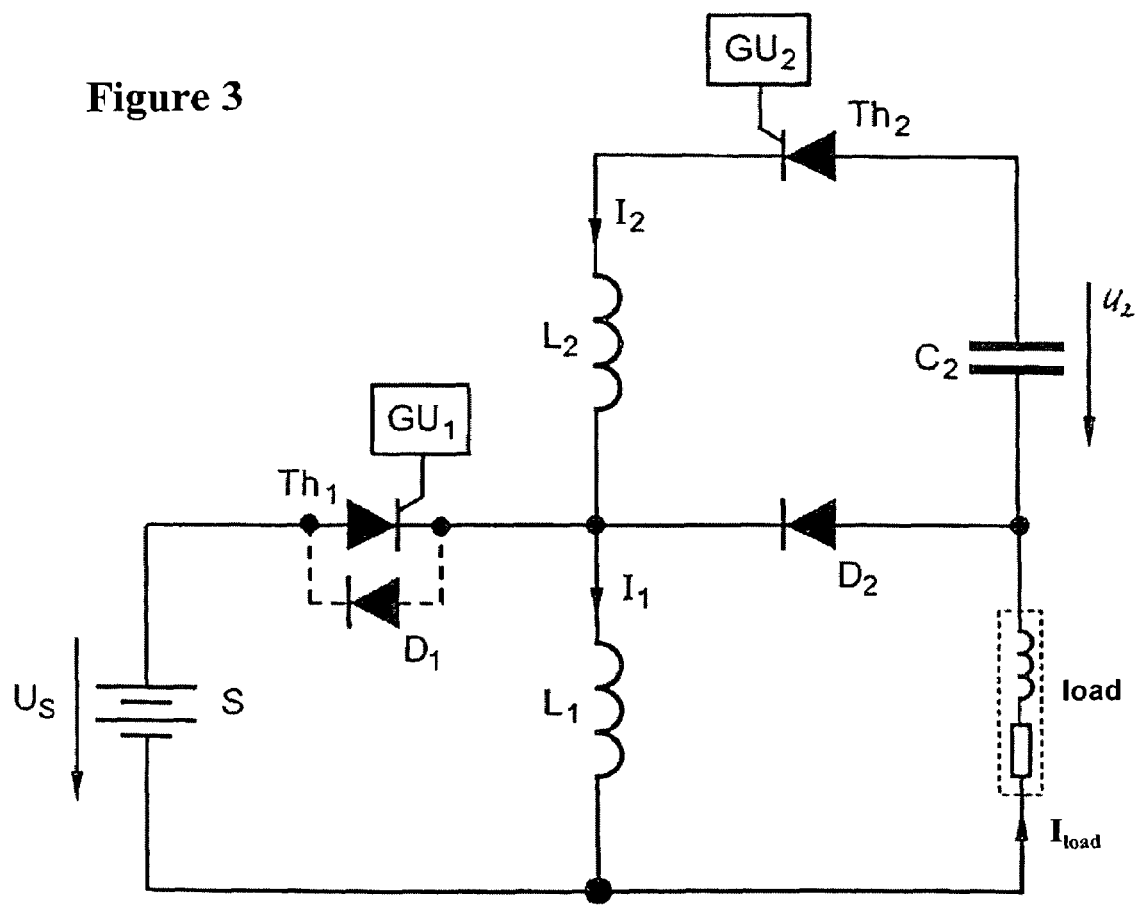

The invention is described below on the basis of a preferred embodiment. There is shown:

FIG. 1A a principle circuit in accordance with the XRAM principle;

FIG. 1B the course of the charge current curve of the storage coils and of the pulse current at the load;

FIG. 2 an embodiment of an XRAM circuit in accordance with the invention, with thyristors as opening switches in accordance with the counter-current principle; and FIG. 3 a circuit variant of an opening switch, in which the counter current pulse can be carried via the load.

FIG. 2 shows an embodiment of a circuit in accordance with the invention with n stages, wherein with the aid of a closing switch $S_L$, which in this variant can consist of a fast, high-power thyristor or an air-gap switch, the charged auxiliary capacitors $C_1$ to $C_n$, which are arranged across the diodes $D_{11}$ to $D_{n1}$, are discharged simultaneously as soon as the desired energy level $E = n \cdot \frac{1}{2} L_s I_s^2$ is available in the magnetic field of the n storage coils $L_s$. The discharge current path of Stage 2 is indicated in FIG. 2 by arrows. This current flows in a backwards direction through the switch to be opened, which in the embodiment is formed by a thyristor $Th_2$ and, after the current zero-crossing, through an auxiliary switch preferably consisting of an anti-parallel diode $D_{23}$. In this phase of the anti-parallel diode $D_{23}$ taking on the current, the switch $Th_2$ can be interrupted at zero power. When using a thyristor as an opening switch, the thyristor is switched to its blocking state by the current falling below the holding current in connection with the so-called release time. In general, however, other switches which can be switched off at zero power during the counter current phase and in particular after the current zero-crossing, e.g. after the current is taken on by the auxiliary switch, can also be used instead of thyristors.

This sequence occurs in each stage and the individual counter currents are added at the load. From a technical viewpoint, it is advantageous to construct the circuits identically for the respective stages of the counter, currents, i.e. for example such that they exhibit the same impedance. Only the counter current circuit, which is formed by the first thyristor $Th_1$ and the feeding current source S, forms an exception. Depending on the level of the impedance in this source circuit, the counter current pulse can be set by varying the charge voltage at the auxiliary capacitor $C_1$ or by changing its capacitance value.

As soon as the thyristors $Th_1$ to $Th_n$ are switched off, the inductive storage coils $L_s$, which are then arranged in parallel, output the current to the load with the aid of the switching diodes $D_{11}, D_{12}, \ldots D_{n2}$. The load current is thus composed initially of the counter current and subsequently of the current supplied by the storage coils $L_s$ of the n stages.

The principle of the XRAM generator with opening switches, in particular semiconductor switches, in accordance with the counter current method incurs the following advantages: Using the switching principle described, the significant advantage of low power dissipation and high thyristor resilience, compared with the actively opening semiconductor switches as far as these are employed as opening switches, can be used. A repetitive operation of an XRAM generator having such a circuitry is also simple to realise.

No switching voltages arise across the opening switches, i.e. for example across the thyristors $Th_1, Th_2, \ldots Th_n$ used in the example embodiment. During the counter current phase, which is simultaneously associated with the current increase at the load, the current flows through the switches $Th_1, Th_2, \ldots Th_n$, whereby these are still in a conducting state. Thus, there is no voltage drop at the components, hence in this phase, current gradients and peak voltages of any level are allowed at the load.

When the switches $Th_1, Th_2, \ldots Th_n$ are switched off, the critical range of the switching phase is already surmounted, which means that there are mainly only the ohmic voltage losses of the load circuit at the switches. Complex series circuits of the switching components or attenuator members are therefore not necessary.

The energy of the auxiliary capacitors $C_1$ to $C_n$ is completely transferred to the load and added to the inductive energy which the storage coils $L_s$ output to the load.

When switches are forceably switched off by a counter current, no problems arise with switching delay (jitter) of the individual components, since they are compulsorily switched off via a single closing switch $S_L$. This simplicity of the circuit enables considerable savings in the control electronics.

One concrete application of this switching principle is in the field of military use, for example in electromagnetic acceleration and electrothermal-chemical drive. In the field of civilian use, such pulse generators can conceivably be used for any applications in which the production of electrical plasmas is required.

The invention claimed is:

1. A circuit for producing a current pulse through a load element, wherein the circuit comprises:
   at least one primary energy storage unit; at least one secondary energy storage unit which can be charged up by the primary energy storage unit;
   at least one opening switching element using which a connection between the primary energy storage unit and the at least one secondary energy storage unit can be interrupted or established; and
   at least one closing switch, using which a connection between the at least one secondary energy storage unit and a load element can be established or interrupted; and
   at least one counter current element which is connected to the at least one opening switching element such that a counter current flows from the at least one counter current element through the at least one opening switching element when the closing switch is closed.

2. The circuit according to claim 1, wherein the primary energy storage unit is a current source or a direct current source.

3. The circuit according to claim 1 or claim 2, wherein the at least one secondary energy storage unit is an inductive element.

4. The circuit according to claim 1 or claim 2, wherein the opening switch is selected from a group consisting of a thyristor, an IGBT, a GTO, a MOSFET or a fast mechanical switch.

5. The circuit according to claim 1 or claim 2, wherein the at least one counter current element is a capacitive element.

6. The circuit according to claim 1 or claim 2, wherein the closing switch is selected from a group consisting of a thyristor, air-gap switch or a fast mechanical switch.

7. The circuit according to claim 1 or claim 2, wherein at least one auxiliary circuit including a diode, is connected in parallel with the at least one opening switching element.

8. The circuit according to claim 1 or claim 2, wherein the circuit is constructed in multiple stages and comprises at least two secondary energy storage units, at least two opening switching elements and at least two counter current elements, wherein each secondary energy storage unit is connected in series to a corresponding opening switching element and is connected in series to at least one other secondary energy storage unit and to at least one other opening switching element, and each counter current element is respectively connected to one opening switching element.

9. The circuit according to claim 1 or claim 2, further comprising a load element.

10. The circuit according to claim 1 or claim 2, wherein at least one diode is connected to the at least one secondary energy storage unit such that a current can flow through a load element from the at least one secondary energy storage unit after the closing switch is closed, and a current in the opposite direction is blocked.

11. The circuit according to claim 1 or claim 2, wherein at least one diode is connected in parallel with the at least one counter current element.

12. The circuit according to claim 1 or claim 2, comprising a control unit for controlling at least one of the at least one opening switching element or the closing switch.

13. A device for electromagnetically accelerating a body, comprising a circuit according to claim 1 or claim 2 and a magnetic field producing load element, using which a magnetic field for accelerating the body can be produced.

14. A method for producing a current pulse through a load element, including the steps of charging at least one secondary energy storage unit by a primary energy storage unit wherein the load element is essentially separated from the secondary energy storage unit during the charge-up sequence, connecting the load element to the at least one secondary energy storage unit to produce a counter current through at least one opening switch which connects the at least one secondary energy storage unit to the primary energy storage unit, whereby the opening switch is opened at zero load or switches to its blocking state.

* * * * *